(12) United States Patent
Lu

(10) Patent No.: US 11,869,930 B2
(45) Date of Patent: Jan. 9, 2024

(54) METHOD FOR FORMING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Yong Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 216 days.

(21) Appl. No.: 17/370,313

(22) Filed: Jul. 8, 2021

(65) Prior Publication Data

US 2021/0335993 A1 Oct. 28, 2021

Related U.S. Application Data

(63) Continuation of application No. PCT/CN2021/077837, filed on Feb. 25, 2021.

(30) Foreign Application Priority Data

Mar. 16, 2020 (CN) .......................... 202010181067.5

(51) Int. Cl.
*H01L 49/02* (2006.01)
*H01L 21/3213* (2006.01)
*H10B 12/00* (2023.01)

(52) U.S. Cl.
CPC ........ *H01L 28/91* (2013.01); *H01L 21/32139* (2013.01); *H01L 28/92* (2013.01); *H10B 12/03* (2023.02)

(58) Field of Classification Search
CPC ............................................... H01L 21/32139
See application file for complete search history.

(56) References Cited

U.S. PATENT DOCUMENTS

| 7,153,740 B2 | 12/2006 | Kim |
| 8,134,823 B2 | 3/2012 | Chen |
(Continued)

FOREIGN PATENT DOCUMENTS

| CN | 1655339 A | 8/2005 |
| CN | 108447864 A | 8/2018 |
(Continued)

OTHER PUBLICATIONS

First Office Action of the Chinese application No. 202010181067.5 dated Feb. 11, 2022, 15 pgs.
(Continued)

*Primary Examiner* — Walter H Swanson
(74) *Attorney, Agent, or Firm* — Cooper Legal Group, LLC

(57) ABSTRACT

A method for forming a semiconductor structure and a semiconductor structure are provided. The method includes: a stacked structure is formed on a surface of a substrate, the stacked structure including supporting layers and sacrificial layers which are alternately stacked; a buffer layer is formed on a surface of the stacked structure facing away from the substrate; capacitor holes penetrating through the stacked structure and the buffer layer and exposing capacitor contacts are formed; a first electrode layer covering inner walls of the capacitor holes is formed; an etching window penetrating through the buffer layer is formed; part of the supporting layers and all of the sacrificial layers in the stacked structure are removed along the etching window; the buffer layer is removed; and a dielectric layer and a second electrode layer are formed to form a capacitor.

14 Claims, 17 Drawing Sheets

(56) References Cited

U.S. PATENT DOCUMENTS

| | | |
|---|---|---|
| 8,169,015 B2 | 5/2012 | Hirota |
| 8,288,224 B2 | 10/2012 | Huang |
| 8,384,143 B2 | 2/2013 | Hirota |
| 8,884,350 B2 | 11/2014 | Hirota |
| 8,912,629 B2 | 12/2014 | Seo |
| 8,927,384 B2 * | 1/2015 | Kim ................ H01L 21/31144 |
| | | 257/E21.651 |
| 9,449,977 B2 | 9/2016 | Seo |
| 9,853,032 B2 | 12/2017 | Seo |
| RE46,798 E | 4/2018 | Hirota |
| 2005/0176210 A1 | 8/2005 | Kim |
| 2006/0211178 A1 | 9/2006 | Kim |
| 2009/0146254 A1 | 6/2009 | Hirota |
| 2009/0257169 A1 | 10/2009 | Chen |
| 2011/0092044 A1 | 4/2011 | Huang |
| 2012/0187537 A1 | 7/2012 | Hirota |
| 2012/0235279 A1 | 9/2012 | Seo |
| 2013/0134556 A1 | 5/2013 | Hirota |
| 2015/0102462 A1 | 4/2015 | Seo |
| 2016/0343716 A1 | 11/2016 | Seo |

FOREIGN PATENT DOCUMENTS

| | | |
|---|---|---|
| CN | 108538822 A | 9/2018 |
| CN | 108550569 A | 9/2018 |
| CN | 108987346 A | 12/2018 |

OTHER PUBLICATIONS

International Search Report in the international application No. PCT/CN2021/077837, dated May 26, 2021, 2 pgs.

* cited by examiner

METHOD FOR FORMING SEMICONDUCTOR STRUCTURE AND SEMICONDUCTOR STRUCTURE

CROSS-REFERENCE TO RELATED APPLICATIONS

The present application a U.S. continuation application of International Application No. PCT/CN2021/077837, filed on Feb. 25, 2021, which claims priority to Chinese Patent Application No. 202010181067.5, filed on Mar. 16, 2020. International Application No. PCT/CN2021/077837 and International Application No. PCT/CN2021/077837 are incorporated herein by reference in their entireties.

TECHNICAL FIELD

The present application relates to the technical field of semiconductor manufacture, and more particularly, to a method for forming a semiconductor structure and the semiconductor structure.

BACKGROUND

A Dynamic Random Access Memory (DRAM) is a common semiconductor structure in electronic devices such as computers. It is composed of a plurality of memory cells. Each memory cell includes a transistor and a capacitor. A gate of the transistor is electrically connected to a word line, a source is electrically connected to a bit line, and a drain is electrically connected to the capacitor. A word line voltage on the word line can control turning on and turning off of the transistor, so that data information stored in the capacitor can be read out from or written into the capacitor through the bit line.

Along with the miniaturization of a size of a semiconductor device, the lateral area thereof on a substrate is reduced. To increase or maintain a sufficiently high capacitance value of the capacitor, it may be desirable to increase the height of a bottom electrode or to decrease the thickness of the bottom electrode. However, increasing the height of the bottom electrode or decreasing the thickness of the bottom electrode will result in a higher aspect ratio and a thinner thickness of the bottom electrode, which will affect the performance reliability of a capacitor array region. For example, collapse or overturning of the bottom electrode may be caused, resulting in a short circuit of adjacent bottom electrodes. To solve the problem, it is possible to improve the stability of the bottom electrode by adding a lateral continuous supporting layer of the electrode. However, a single lateral supporting layer has its height limit, such that the capacitance value of the capacitor is limited by the height of the electrode and the risk of overturning and extensive collapse of the electrode still exists.

Therefore, how to solve the problem of lateral instability of the capacitor array region, reduce the risk of collapse or overturning of the bottom electrode, and improve the performance stability of the semiconductor devices is a technical problem to be solved urgently at present.

SUMMARY

The present application provides a method for forming a semiconductor structure and a semiconductor structure, to solve the problem of poor lateral stability of a capacitor array region in the semiconductor structure, so as to reduce the risk of collapse or overturning of a bottom electrode, and to improve the performance stability of a semiconductor device.

In order to solve the above problems, the present application provides a method for forming a semiconductor structure, including the following steps.

A stacked structure is formed on a surface of a substrate, capacitor contacts being arranged in the substrate, and the stacked structure including supporting layers and sacrificial layers which are alternately stacked along a direction perpendicular to the substrate.

A buffer layer is formed on a surface of the stacked structure facing away from the substrate.

Capacitor holes penetrating through the stacked structure and the buffer layer and exposing the capacitor contacts are formed.

A first electrode layer covering inner walls of the capacitor holes and contacting with the capacitor contacts is formed.

An etching window penetrating through the buffer layer and exposing the stacked structure is formed.

Part of the supporting layers and all of the sacrificial layers in the stacked structure are removed along the etching window, at least three of the supporting layers being remained and connected with a side wall of the first electrode layer.

The buffer layer is removed, such that the first electrode layer protrudes over a residual stacked structure.

A dielectric layer covering a surface of the first electrode layer and a surface of the residual stacked structure is formed, and a second electrode layer covering a surface of the dielectric layer is formed, to form a capacitor.

Optionally, a stacked structure is formed on a surface of a substrate may include the following specific operations.

A substrate is provided, capacitor contacts being arranged in the substrate.

A first supporting layer, a first sacrificial layer, a second supporting layer, a second sacrificial layer, and a third supporting layer are deposited in sequence along the direction perpendicular to the substrate.

Optionally, the first electrode layer covers the inner walls of the capacitor holes and the surface of the buffer layer. An etching window penetrating through the buffer layer and exposing the stacked structure is formed may include the following specific operations.

A mask layer covering a surface of the first electrode layer is formed, an etching pattern exposing the first electrode layer being arranged in the mask layer.

The first electrode layer and the buffer layer are etched in sequence along the etching pattern to form the etching window exposing the third supporting layer.

Optionally, part of the supporting layers and all of the sacrificial layers in the stacked structure are removed along the etching window may include the following specific operations.

Part of the third supporting layer is etched along the etching window to form a first opening exposing the second sacrificial layer, a residual third supporting layer being connected with a side wall of the first electrode layer.

The second sacrificial layer is removed along the first opening to expose the second supporting layer.

Part of the second supporting layer is etched along the first opening to form a second opening exposing the first sacrificial layer.

The first sacrificial layer is removed along the second opening.

Optionally, one etching window overlaps three or more of the capacitor holes.

Optionally, the first opening exposing the second sacrificial layer is formed may include the following specific operations.

Part of the first electrode layer in a region overlapping the etching pattern is removed.

Part of the buffer layer is removed along the etching pattern.

Part of the third supporting layer is removed along the etching pattern to form the first opening exposing the second sacrificial layer.

Optionally, part of the supporting layers and all of the sacrificial layers in the stacked structure are removed along the etching window may further include the following operations.

Part of the mask layer is etched while part of the third supporting layer is etched along the etching window.

A residual mask layer is etched away to expose the first electrode layer while part of the second supporting layer is etched along the first opening.

The first electrode layer covering the surface of the buffer layer is removed to expose the buffer layer.

Optionally, a dielectric layer covering a surface of the first electrode layer and a surface of a residual stacked structure, and a second electrode layer covering a surface of the dielectric layer are formed may include the following specific operations.

The dielectric layer covering a surface of the first electrode layer, a surface of a residual third supporting layer, a surface of a residual second supporting layer and a surface of the first supporting layer is formed.

The second electrode layer covering the surface of the dielectric layer is formed.

A conductive layer covering a surface of the second electrode layer is formed.

Optionally, a thickness of the third supporting layer may be greater than that of the second supporting layer.

In order to solve the above problems, the present application further provides a semiconductor structure, which is formed by using the method for forming a semiconductor structure as described above.

According to the method for forming a semiconductor structure and the semiconductor structure provided by the present application, the buffer layer is formed on the surface of the stacked structure, so that the top supporting layer can be protected in an etching process. At least part of each of the supporting layers in the initially formed stacked structure can be remained on the side wall of the first electrode layer, so that the finally formed capacitor has a sufficient height, the limit on the height of the capacitor by a single lateral supporting layer in the related art is avoided, the lateral stability of the capacitor array region is improved, and the electrical performance of the semiconductor structure is improved. Furthermore, by providing a plurality of lateral supporting layers, it is helpful to further reduce the thickness of the first electrode layer, thereby effectively increasing the capacitance value of the capacitor.

DETAILED DESCRIPTION

Examples of a method for forming a semiconductor structure and a semiconductor structure provided by the present application will be described below in detail in combination with the accompanying drawings.

Figure 1:
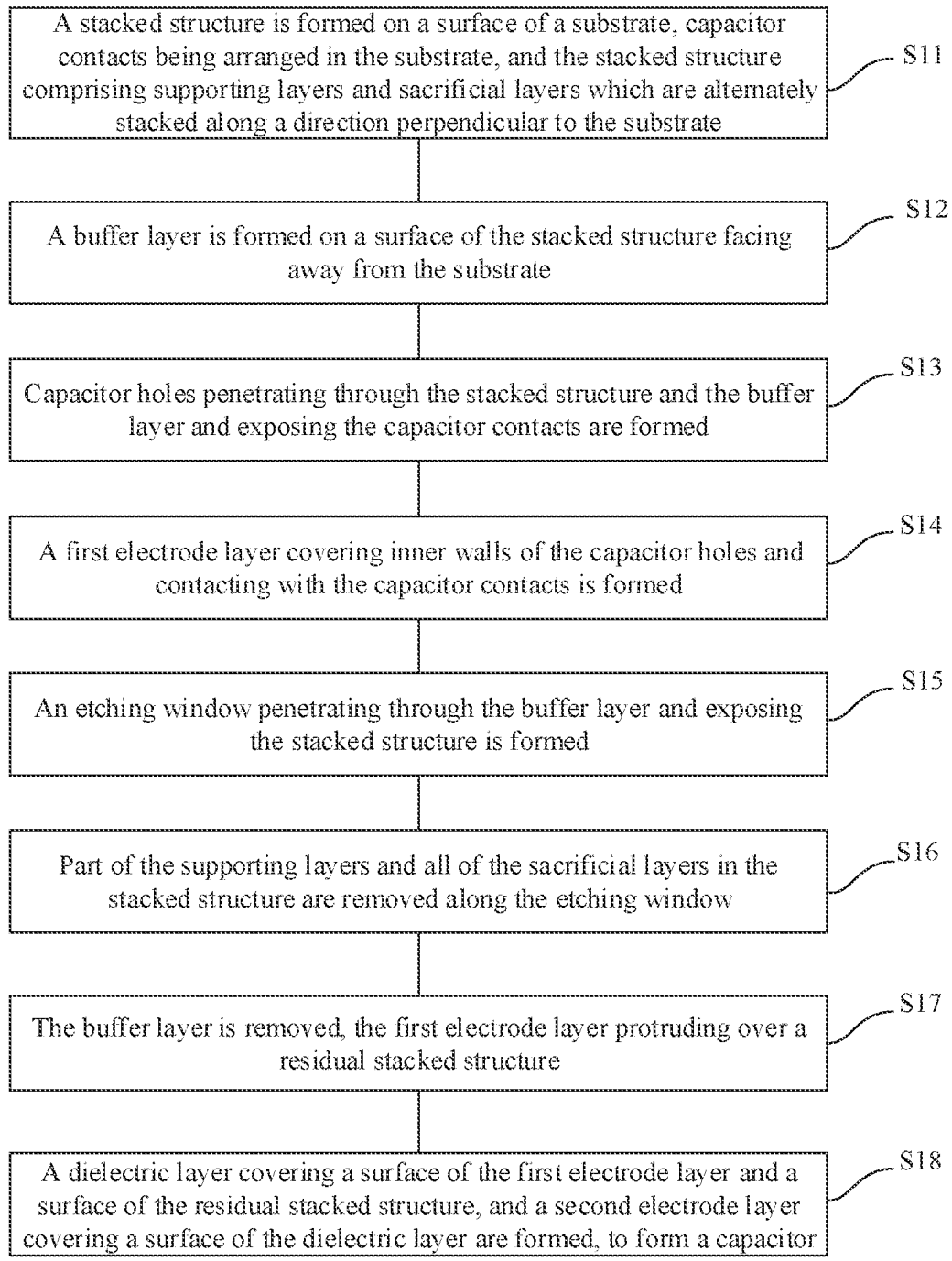
FIG. 1 is a flow chart of a method for forming a semiconductor structure according to an example of the present application.
Figure 2A:
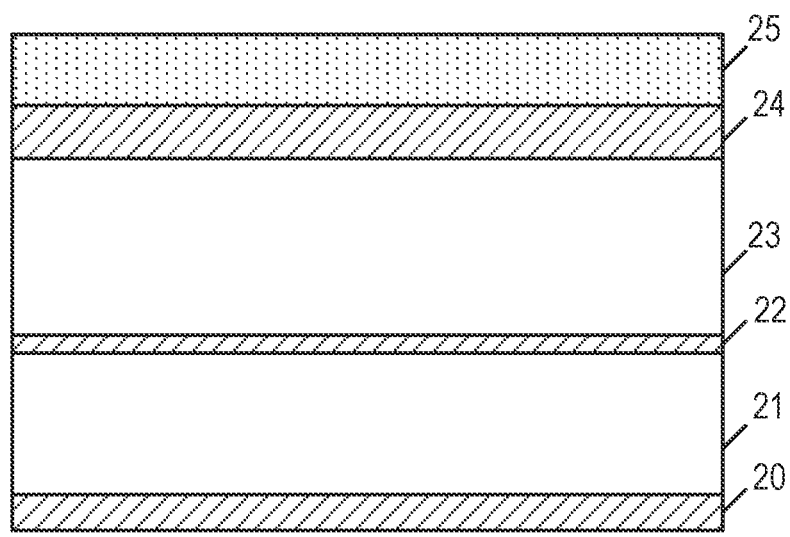
FIG. 2A to FIG. 2P are schematic cross-sectional views of main processes during forming a semiconductor structure according to the example of the present application.

An example provides a method for forming a semiconductor structure. FIG. 1 is a flow chart of a method for forming a semiconductor structure according to the example of the present application. FIG. 2A to FIG. 2P are schematic cross-sectional views of main processes during forming a semiconductor structure according to examples of the present application. As shown in FIG. 1 and FIG. 2A to FIG. 2P, the method for forming a semiconductor structure provided by the examples includes the following steps.

At S11, a stacked structure is formed on a surface of a substrate, capacitor contacts being arranged in the substrate, and the stacked structure including supporting layers and sacrificial layers which are alternately stacked along a direction perpendicular to the substrate, as shown in FIG. 2A.

The specific number of the supporting layers and the sacrificial layers stacked in the stacked structure may be selected by those skilled in the art according to practical requirements. In the example, in order to subsequently form a plurality of supporting layers for supporting an electrode structure in a capacitor, the number of the supporting layers in the stacked structure is at least three, and correspondingly the number of the sacrificial layers is at least two. In order to further simplify a manufacture process of the semiconductor structure, optionally, a stacked structure is formed on a surface of a substrate includes the following specific operations.

A substrate is provided, capacitor contacts (not shown in the figures) being arranged in the substrate.

A first supporting layer 20, a first sacrificial layer 21, a second supporting layer 22, a second sacrificial layer 23 and a third supporting layer 24 are deposited on the surface of the substrate in sequence along a direction perpendicular to the substrate, as shown in FIG. 2A.

In particular, a plurality of active regions are arranged in an array in the substrate, the capacitor contacts being electrically connected with the active regions. The first supporting layer 20, the first sacrificial layer 21, the second supporting layer 22, the second sacrificial layer 23 and the third supporting layer 24 are deposited in sequence along a direction from the substrate to the stacked structure. Materials of the first supporting layer 20, the second supporting layer 22, and the third supporting layer 24 may be the same, for example, a nitride material (for example, silicon nitride). The materials of the first sacrificial layer 21 and the second sacrificial layer 23 may also be the same, for example, an oxide material (for example, silicon oxide).

At S12, a buffer layer 25 is formed on a surface of the stacked structure facing away from the substrate, as shown in FIG. 2A.

In particular, the material of the buffer layer 25 may be an organic material, for example, carbon.

Figure 2B:
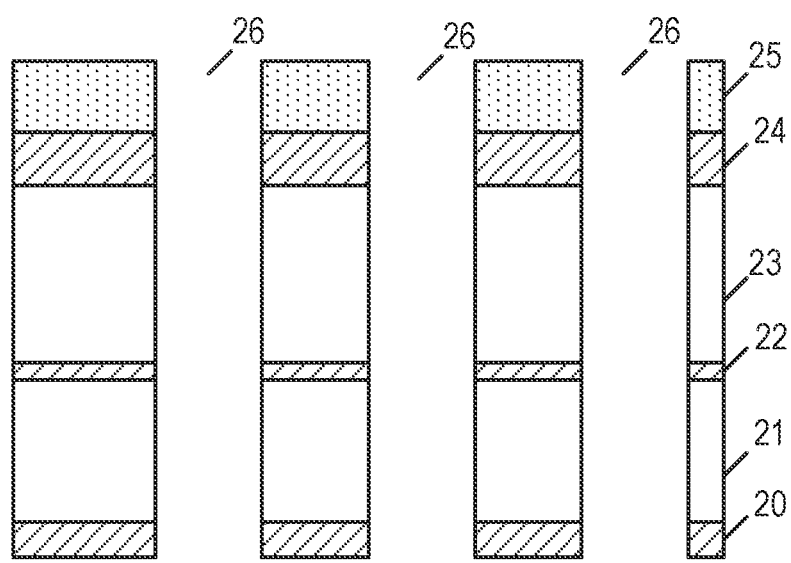
Figure 2C:
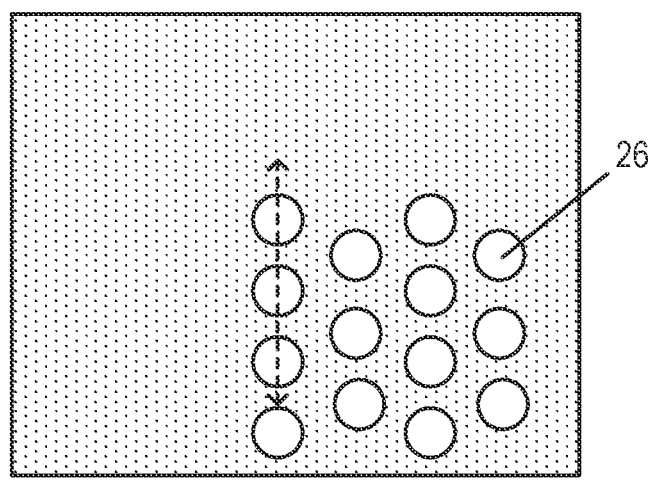

At S13, capacitor holes 26 penetrating through the stacked structure and the buffer layer 25 and exposing the capacitor contacts are formed, as shown in FIG. 2B and FIG. 2C. FIG. 2B is a schematic cross-sectional view of FIG. 2C along a dotted line direction.

In particular, after the buffer layer 25 covering the stacked structure is formed, the capacitor holes 26 penetrating through the buffer layer 25 and the stacked structure may be formed along a direction perpendicular to the substrate by using a dry etching process or a wet etching process. The capacitor contacts in the substrate are exposed through the capacitor holes.

Figure 2D:
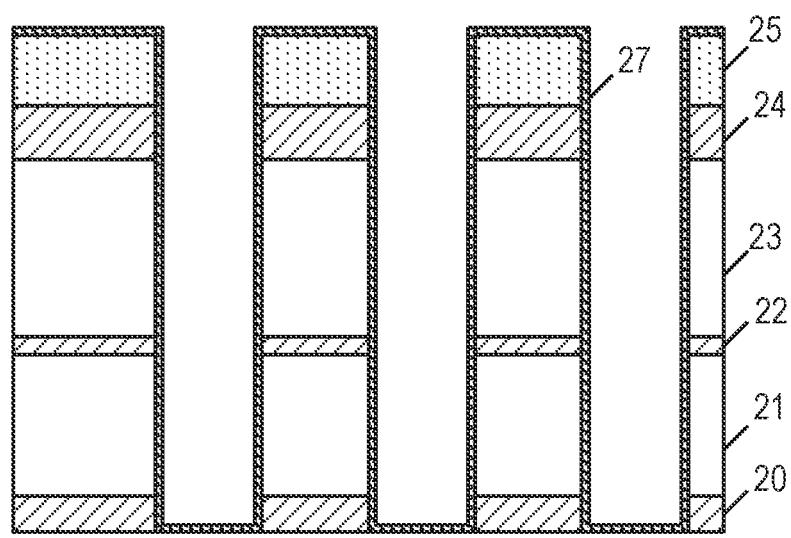
Figure 2E:
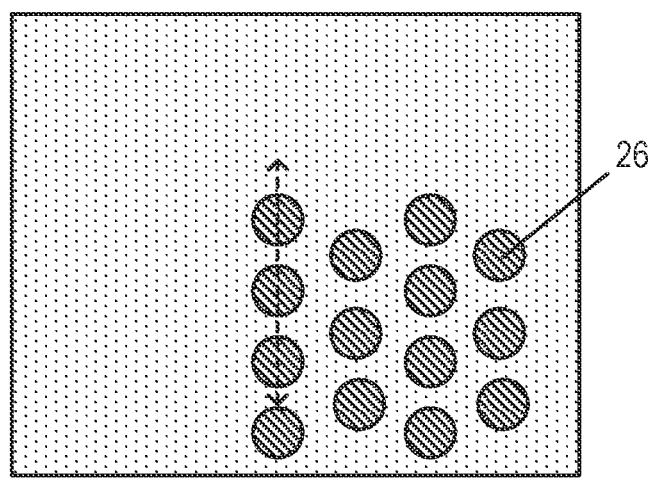
Figure 2F:
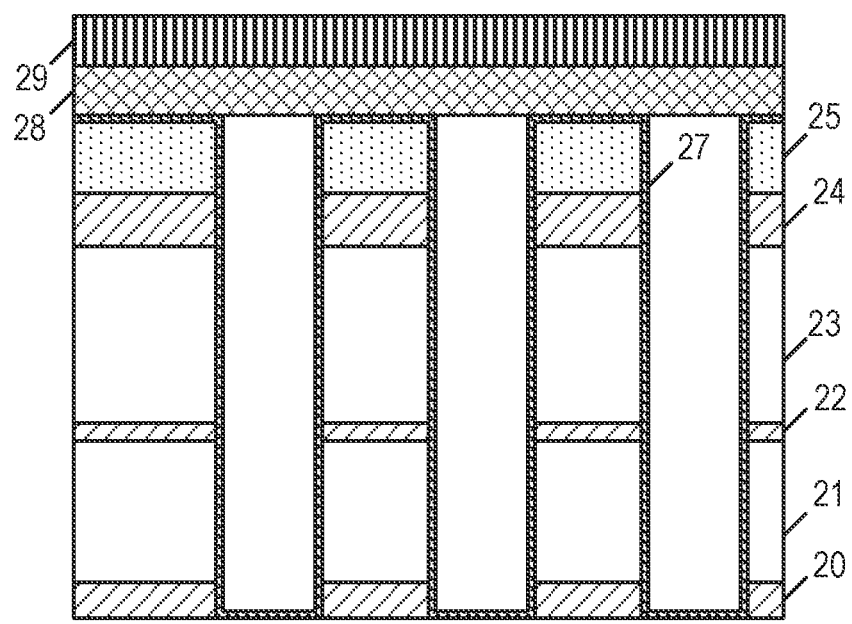

At S14, a first electrode layer 27 covering inner walls of the capacitor holes 26 and contacting with the capacitor contacts is formed, as shown in FIG. 2D and FIG. 2E. FIG. 2D is a schematic cross-sectional view of FIG. 2E along a dotted line direction.

At S15, an etching window penetrating through the buffer layer 25 and exposing the stacked structure is formed.

In particular, the first electrode layer 27 may be deposited on side walls and bottom walls of the capacitor holes 26 and a surface of the buffer layer 25 facing away from the third supporting layer 24 by using a chemical vapor deposition process or a physical vapor deposition process. The material of the first electrode layer 27 may be, but is not limited to, titanium nitride. The thickness of the first electrode layer 27 may be selected by those skilled in the art according to practical requirements.

Optionally, the first electrode layer 27 covers the inner walls of the capacitor holes 26 and the surface of the buffer layer 25, as shown in FIG. 2D and FIG. 2E. An etching window penetrating through the buffer layer 25 and exposing the stacked structure is formed includes the following operations.

A mask layer covering a surface of the first electrode layer 27 is formed, an etching pattern exposing the first electrode layer 27 being arranged in the mask layer.

The first electrode layer 27 and the buffer layer 25 are etched in sequence along the etching pattern to form the etching window exposing the third supporting layer 24.

In particular, after the first electrode layer 27 is formed, the mask layer is formed on the first electrode layer 27 on a top surface of the buffer layer 25, and the capacitor holes 26 are sealed to facilitate subsequent etching of the third supporting layer 24. The mask layer may be a hard mask layer. The mask layer may be a single mask layer, or a stacked layer formed by a number of mask layers. In the example, the mask layer including a first sub-mask layer 28 and a second sub-mask layer 29 is illustrated. The material of the first sub-mask layer 28 may be a nitride material, for example, silicon nitride. The material of the second sub-mask layer 29 may be an oxide or oxynitride material.

Figure 2G:
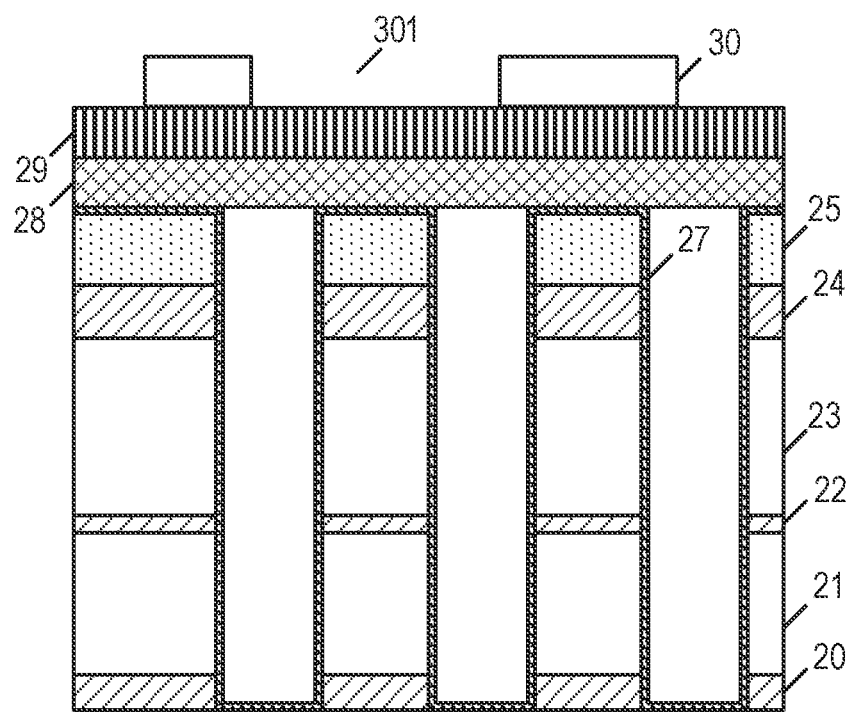
Figure 2H:
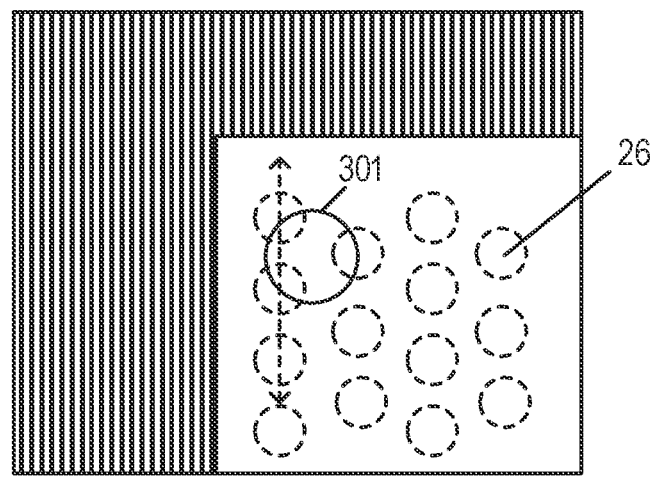
Figure 2I:
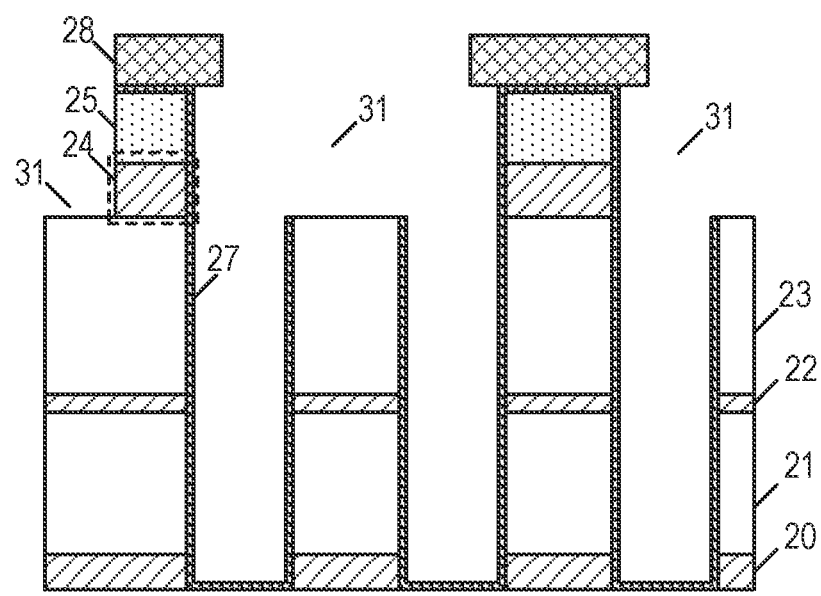
Figure 2J:
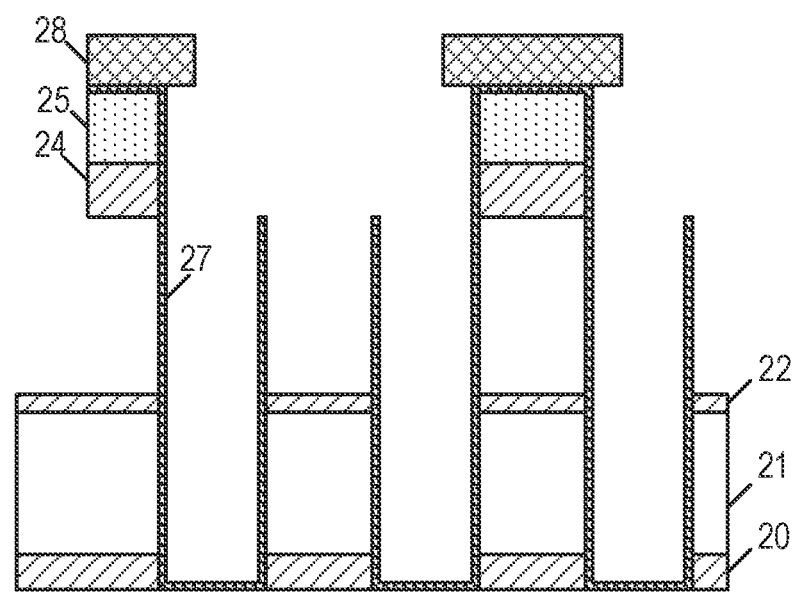
Figure 2K:
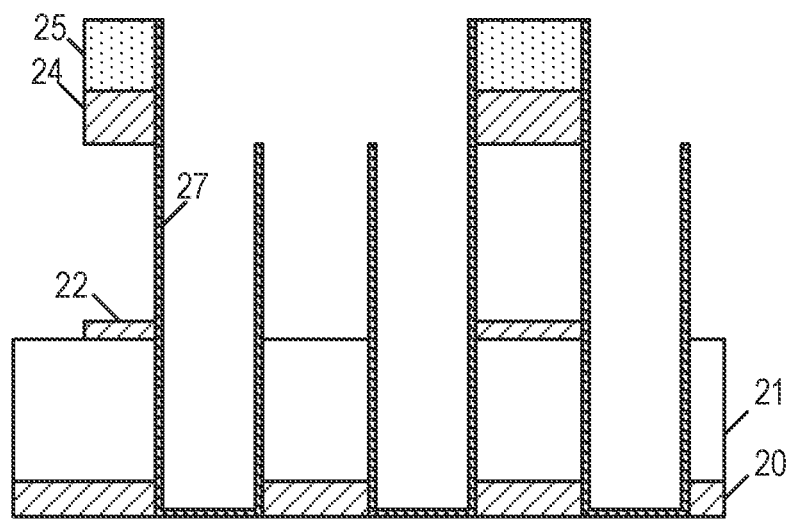

After the first sub-mask layer 28 and the second sub-mask layer 29 are formed, a photoresist layer 30 is formed on a surface of the second sub-mask layer 29 facing away from the first sub-mask layer 28. An etching opening 301 exposing the second sub-mask layer 29 is arranged in the photoresist layer 30, as shown in FIG. 2G and FIG. 2H. FIG. 2G is a schematic cross-sectional view of FIG. 2H along a dotted line direction. Then, the second sub-mask layer 29 and the first sub-mask layer 28 are etched along the etching opening 301 to form an etching pattern penetrating through the second sub-mask layer 29 and the first sub-mask layer 28, and the etching pattern exposes the first electrode layer 27. And then the first electrode layer 27 and the buffer layer 25 are etched along the etching pattern to form the etching window exposing the third supporting layer 24.

In the example, one etching opening 301 overlapping three of the capacitor holes 26 is illustrated, as shown in FIG. 2G and FIG. 2H. In other examples, those skilled in the art may also set that one etching opening 301 overlaps one, two, three or more of the capacitor holes according to practical requirements.

Figure 2L:
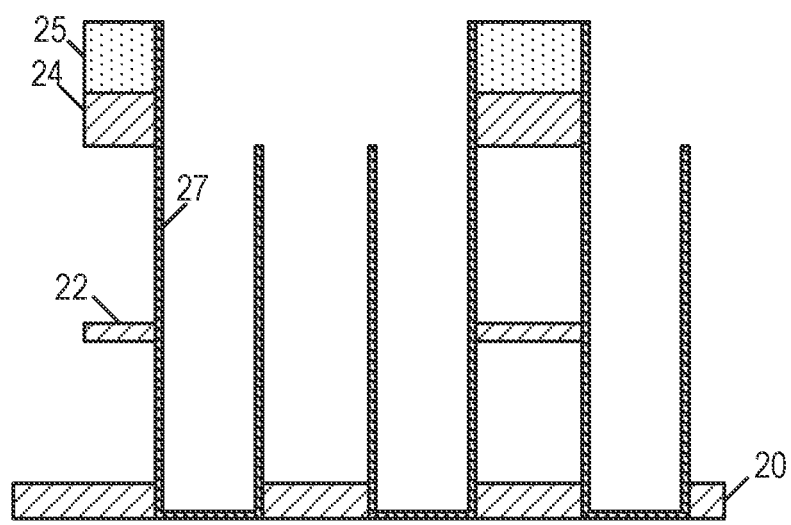

At S16, part of the supporting layers and all of the sacrificial layers in the stacked structure are removed along the etching window, as shown in FIG. 2L.

Optionally, part of the supporting layers and all of the sacrificial layers in the stacked structure are removed along the etching window may include the following specific operations.

Part of the third supporting layer 24 is etched along the etching window to form a first opening exposing the second sacrificial layer 23, the residual third supporting layer 24 being connected with a side wall of the first electrode layer 27, as shown in FIG. 2I.

The second sacrificial layer 23 is removed along the first opening 31 to expose the second supporting layer 22, as shown in FIG. 2J.

Part of the second supporting layer 22 is etched along the first opening 31 to form a second opening exposing the first sacrificial layer 21, as shown in FIG. 2K.

The first sacrificial layer 21 is removed along the second opening, as shown in FIG. 2L.

Optionally, the first opening 31 exposing the second sacrificial layer 23 is formed includes the following specific operations.

Part of the first electrode layer 27 in a region overlapping the etching pattern is removed.

Part of the buffer layer 25 is removed along the etching pattern.

Part of the third supporting layer 24 is removed along the etching pattern to form the first opening 31 exposing the second sacrificial layer 23.

In particular, the first electrode layer 27 is selectively etched along the etching window, so that the top surface of the first electrode layer 27 in the region overlapping the etching pattern is flush with a bottom surface of the third supporting layer 24 to facilitate subsequent etching of the buffer layer 25 and the third supporting layer 24. Subsequently, the buffer layer 25 and the third supporting layer 24 are selectively etched along the etching pattern to form the first opening 31 exposing the second sacrificial layer 23.

In a process of removing part of the buffer layer 25, part of the third supporting layer 24 and part of the first electrode layer 27 along the etching pattern, the height of the first electrode layer 27 in the region overlapping the etching pattern is reduced to be smaller than that of the first electrode layer 27 in the region not overlapping the etching pattern. For the part in the region not overlapping the etching pattern, the third supporting layer 24 is remained due to the coverage of the first electrode layer 27 and the buffer layer 25, so that after the etching is finished, the residual third supporting layer 24 (for example, the third supporting layer 24 shown in a dotted box in FIG. 2I) is vertically connected with the side wall of the first electrode layer 27 to support the first electrode layer.

After the first opening 31 is formed, the second sub-mask layer 29 may be removed first. Then, the second sacrificial layer 23 is entirely removed through the first opening 31 by using a wet etching process to obtain a structure shown in FIG. 2J. Part of the second supporting layer 22 is then etched along the first opening 31 to form the second opening exposing the first sacrificial layer 21, as shown in FIG. 2K. The residual second supporting layer 22 is vertically connected to the side wall of the first electrode layer 27 to support the first electrode layer 27. The first sacrificial layer 21 is entirely removed from the second opening by using the wet etching process to obtain a structure shown in FIG. 2L.

Optionally, part of the supporting layers and all of the sacrificial layers in the stacked structure are removed along the etching window may also include the following specific operations.

Part of the mask layer is etched while part of the third supporting layer 24 is etched along the etching window.

The residual mask layer 28 is etched to expose the first electrode layer 27 while part of the second supporting layer 22 is etched along the first opening 31.

The first electrode layer 27 covering the surface of the buffer layer 25 is removed to expose the buffer layer 25.

For example, the first supporting layer 20, the second supporting layer 22, the third supporting layer 24 and the first sub-mask layer 28 in the stacked structure are made of the same nitride material (for example, silicon nitride). In a process of etching the third supporting layer 24 along the etching window, part of the first sub-mask layer 28 is also etched away, but the third supporting layer 24 in a region which is covered by the buffer layer 25 and does not overlap the etching window is not etched. In a process of etching part of the second supporting layer 22 along the first opening 31, the residual first sub-mask layer 28 is also etched away, so that the first electrode layer 27 on the top surface of the buffer layer 25 is exposed. The first electrode layer 27 covering the surface of the buffer layer 25 is etched away to expose the buffer layer 25 by taking the buffer layer 25 as an etching cut-off layer.

Those skilled in the art may also select the material of the first sub-mask layer 28 to be different from that of the third supporting layer 24 and the second supporting layer 22 in the stacked structure according to practical requirements, so that a removal procedure of the first sub-mask layer 28 is performed separately from an etching procedure of the third supporting layer 24 and the second supporting layer 22. The sequence in which the first sub-mask layer 28, the third supporting layer 24, the second supporting layer 22, the second sacrificial layer 23 and the first sacrificial layer 21 are removed is not limited in the example and may be selected by those skilled in the art according to practical requirements.

Figure 2M:
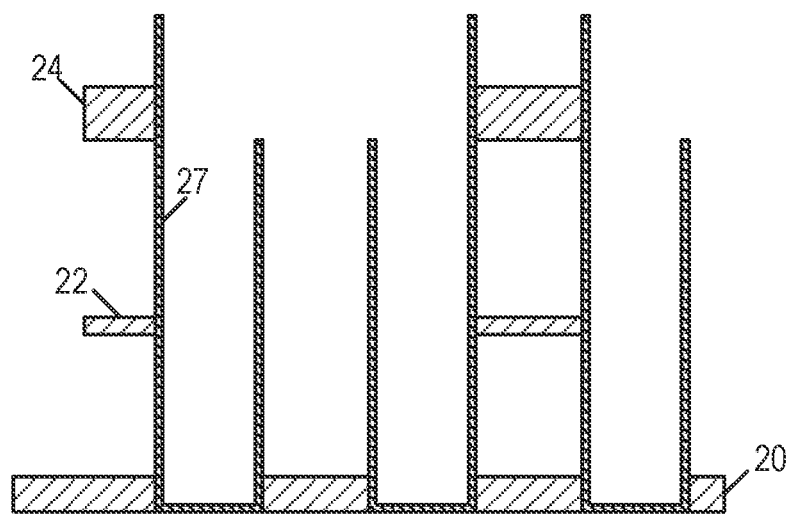

At S17, the buffer layer 25 is removed, such that the first electrode layer 27 protrudes over a residual stacked structure, as shown in FIG. 2M.

In particular, the buffer layer 25 is etched away by taking the third supporting layer 24 as an etching cut-off layer, so that part of the first electrode layer 27 protrudes over the residual third supporting layer 24, thereby increasing the height of the first electrode layer 27. In addition, since the residual third supporting layer 24 and the residual second supporting layer 22 still exist on the side wall of the first electrode layer 27, the first electrode layer 27 having a higher height can be stably supported, thereby enhancing the lateral stability of the capacitor array region. Meanwhile, since the residual third supporting layer 24 and the residual second supporting layer 22 exist, the thickness of the first electrode layer 27 may also be correspondingly reduced, thereby increasing a capacitance value of a capacitor.

Figure 2N:
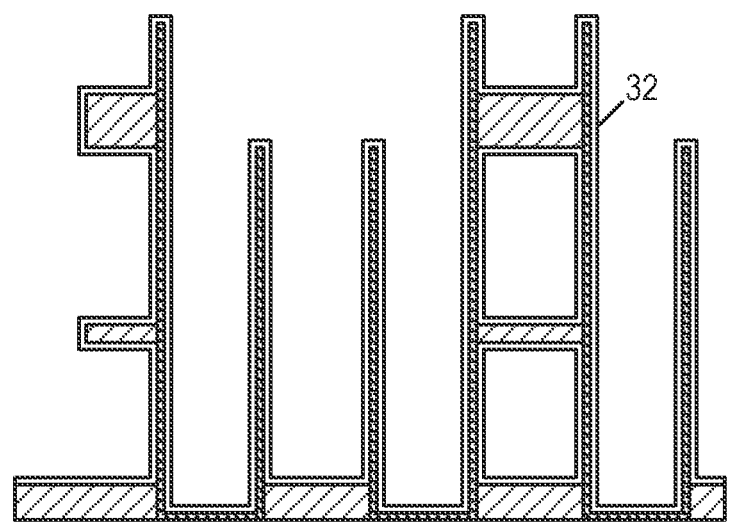
Figure 2O:
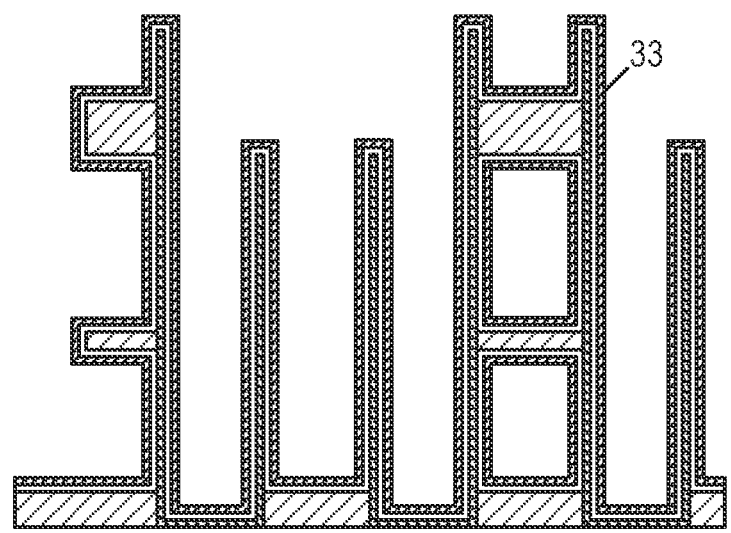
Figure 2P:
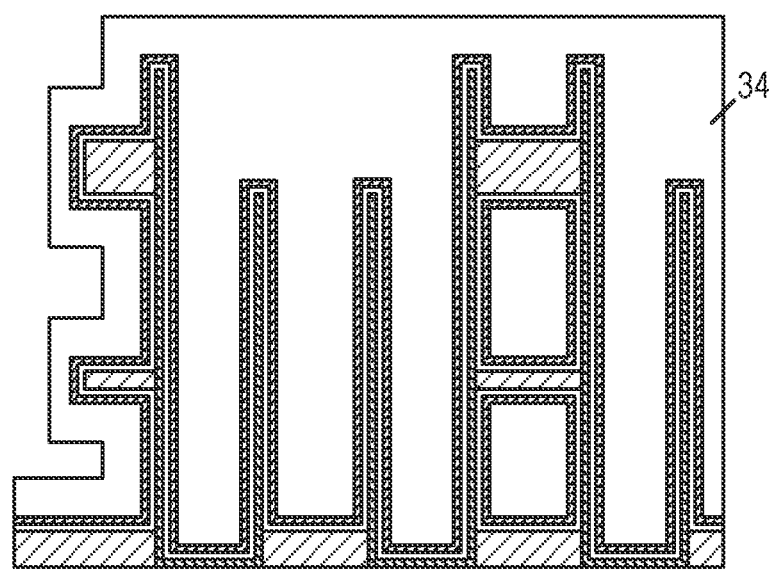

At S18, a dielectric layer 32 covering a surface of the first electrode layer 27 and a surface of the residual stacked structure, and a second electrode layer 33 covering a surface of the dielectric layer 32 are formed to form the capacitor, as shown in FIG. 2N and FIG. 2O.

Optionally, a dielectric layer 32 covering a surface of the first electrode layer 27 and a surface of the residual stacked structure, and a second electrode layer 33 covering a surface of the dielectric layer 32 are formed includes the following specific operations.

The dielectric layer 32 covering a surface of the first electrode layer 27, a surface of the residual third supporting layer 24, a surface of the residual second supporting layer 22 and a surface of the first supporting layer 20 is formed, as shown in FIG. 2N.

The second electrode layer 33 covering a surface of the dielectric layer 32 is formed, as shown in FIG. 2O.

A conductive layer 34 covering a surface of the second electrode layer 33 is formed, as shown in FIG. 2P.

In particular, the material of the dielectric layer 32 is preferably a material having a higher dielectric constant. Materials of the second electrode layer 33 and the first electrode layer 27 may be the same, for example, titanium nitride. The material of the conductive layer 34 may be, but is not limited to, a polysilicon material.

Optionally, the thickness of the third supporting layer 24 is greater than that of the second supporting layer 22.

In particular, by setting the thickness of the third supporting layer 24 to be greater than that of the second supporting layer 22, it is helpful to support the top of the first electrode layer 27 and improve the stability of the top of the first electrode layer 27. Those skilled in the art may also set the thickness of the first sacrificial layer 21 to be greater than that of the second sacrificial layer 23 as required, which also facilitates the support to the top of the first electrode layer 27.

Moreover, an example provides a semiconductor structure, which is formed by using the method for forming a semiconductor structure as described above. The schematic diagram of the semiconductor structure provided by the example is shown in FIG. 2P.

According to the method for forming a semiconductor structure and the semiconductor structure provided by the examples, the buffer layer is formed on the surface of the stacked structure, so that the top supporting layer can be protected in an etching procedure. At least part of each of the supporting layers in the initially formed stacked structure can be remained on the side wall of the first electrode layer, so that the finally formed capacitor has a sufficient height, the limit on the height of the capacitor by a single lateral supporting layer in the related art is avoided, the lateral stability of the capacitor array region is improved, and the electrical performance of the semiconductor structure is improved. Furthermore, by providing a plurality of lateral supporting layers, it is helpful to further reduce the thickness of the first electrode layer, thereby effectively increasing the capacitance value of the capacitor.

The above are only preferred examples of the disclosure. It should be noted that those of ordinary skill in the art may further make improvements and modifications without departing from the principle of the present application, and these improvements and modifications should also be construed as falling into the scope of protection of the present application.

The invention claimed is:

1. A method for forming a semiconductor structure, comprising:

forming a stacked structure on a surface of a substrate, capacitor contacts being arranged in the substrate, and the stacked structure comprising supporting layers and sacrificial layers which are alternately stacked along a direction perpendicular to the substrate wherein the forming the stacked structure on the surface of the substrate comprises:

providing the substrate; and depositing a first supporting layer, a first sacrificial layer, a second supporting layer, a second sacrificial layer, and a third supporting layer in sequence along the direction perpendicular to the substrate;

forming a buffer layer on a surface of the third supporting layer facing away from the substrate;

forming capacitor holes penetrating through the stacked structure and the buffer layer and exposing the capacitor contacts;

forming a first electrode layer covering side walls and bottom walls of the capacitor holes and a surface of the buffer layer facing away from the third supporting layer and contacting with the capacitor contacts;

forming a mask layer on a surface of the first electrode layer which is located on the surface of the buffer layer facing away from the third supporting layer, such that the capacitor holes are sealed, wherein an etching pattern exposing the first electrode layer is arranged in the mask layer;

forming an etching window penetrating through the buffer layer and exposing the third supporting layer, by etching the first electrode layer and the buffer layer in sequence along the etching pattern;

removing part of the supporting layers and all of the sacrificial layers in the stacked structure along the etching window;

removing the buffer layer after the removing part of the supporting layers and all of the sacrificial layers such that the first electrode layer protrudes over a residual stacked structure; and forming a dielectric layer covering the surface of the first electrode layer and a surface of the residual stacked structure, and a second electrode layer covering a surface of the dielectric layer, to form a capacitor.

2. A semiconductor structure, wherein the semiconductor structure is formed by using the method for forming the semiconductor structure of claim 1.

3. The method for forming the semiconductor structure of claim 1, wherein a thickness of the third supporting layer is greater than that of the second supporting layer.

4. A semiconductor structure, wherein the semiconductor structure is formed by using the method for forming the semiconductor structure of claim 3.

5. The method for forming the semiconductor structure of claim 1, wherein the removing part of the supporting layers and all of the sacrificial layers in the stacked structure along the etching window comprises:

etching part of the third supporting layer along the etching window to form a first opening exposing the second sacrificial layer, a residual third supporting layer being connected with a side wall of the first electrode layer;

removing the second sacrificial layer along the first opening to expose the second supporting layer;

etching part of the second supporting layer along the first opening to form a second opening exposing the first sacrificial layer; and removing the first sacrificial layer along the second opening.

6. A semiconductor structure, wherein the semiconductor structure is formed by using the method for forming the semiconductor structure of claim 5.

7. The method for forming the semiconductor structure of claim 5, wherein the etching window overlaps three or more of the capacitor holes.

8. A semiconductor structure, wherein the semiconductor structure is formed by using the method for forming the semiconductor structure of claim 7.

9. The method for forming the semiconductor structure of claim 5, wherein forming the first opening exposing the second sacrificial layer comprises:

removing part of the first electrode layer in a region overlapping the etching pattern;

removing part of the buffer layer along the etching pattern; and removing part of the third supporting layer along the etching pattern to form the first opening exposing the second sacrificial layer.

10. A semiconductor structure, wherein the semiconductor structure is formed by using the method for forming the semiconductor structure of claim 9.

11. The method for forming the semiconductor structure of claim 5, wherein the removing part of the supporting layers and all of the sacrificial layers in the stacked structure along the etching window further comprises:

etching part of the mask layer while etching the part of the third supporting layer along the etching window;

etching a residual mask layer to expose the first electrode layer while etching the part of the second supporting layer along the first opening; and removing the first electrode layer covering the surface of the buffer layer to expose the buffer layer.

12. A semiconductor structure, wherein the semiconductor structure is formed by using the method for forming the semiconductor structure of claim 11.

13. The method for forming the semiconductor structure of claim 5, wherein the forming the dielectric layer covering the surface of the first electrode layer and the surface of the residual stacked structure, and the second electrode layer covering the surface of the dielectric layer comprises:

forming the dielectric layer covering the surface of the first electrode layer, a surface of the residual third supporting layer, a surface of a residual second supporting layer and a surface of the first supporting layer;

forming the second electrode layer covering the surface of the dielectric layer; and forming a conductive layer covering a surface of the second electrode layer.

14. A semiconductor structure, wherein the semiconductor structure is formed by using the method for forming the semiconductor structure of claim 13.

* * * * *